United States Patent
Surasigcha et al.

(10) Patent No.: US 9,044,930 B1
(45) Date of Patent: Jun. 2, 2015

(54) STENCIL ASSEMBLY STRUCTURE

(71) Applicant: DET International Holding Limited, George Town (KY)

(72) Inventors: Ruay Surasigcha, Samutprakarn (TH); Pornthep Sukkhee, Samutprakarn (TH)

(73) Assignee: DET INTERNATIONAL HOLDING LIMITED, George Town (KY)

( * ) Notice: Subject to any disclaimer, the term of this patent is extended or adjusted under 35 U.S.C. 154(b) by 0 days.

(21) Appl. No.: 14/156,074

(22) Filed: Jan. 15, 2014

(30) Foreign Application Priority Data

Dec. 31, 2013 (TW) .............................. 102149252 A

(51) Int. Cl.
*B41F 15/34* (2006.01)
*B41L 13/02* (2006.01)
*B41F 15/36* (2006.01)

(52) U.S. Cl.
CPC ............... *B41F 15/34* (2013.01); *B41L 13/02* (2013.01); *B41F 15/36* (2013.01)

(58) Field of Classification Search
CPC ...................................................... B41F 15/36
See application file for complete search history.

(56) References Cited

U.S. PATENT DOCUMENTS

| | | | | |
|---|---|---|---|---|
| 2,757,607 A | * | 8/1956 | Fordyce | 101/127.1 |
| 2,818,803 A | * | 1/1958 | Levorson | 101/127.1 |
| 5,732,624 A | * | 3/1998 | Karlyn et al. | 101/127.1 |
| 5,941,171 A | * | 8/1999 | Fromm | 101/127.1 |

FOREIGN PATENT DOCUMENTS

| | | |
|---|---|---|
| TW | M321842 | 11/2007 |
| TW | 201315322 | 4/2013 |

* cited by examiner

*Primary Examiner* — Jill Culler
(74) *Attorney, Agent, or Firm* — Kirton McConkie; Evan R. Witt

(57) ABSTRACT

A stencil assembly structure is used for printing solder paste on a printed circuit board. The stencil assembly structure includes a stencil and a fixing frame. The stencil includes plural first apertures and plural second aperture. The plural first apertures are collaboratively defined as a solder paste printing region. The fixing frame includes a frame body and plural guide pins. After the plural guide pins of the frame body are penetrated through the corresponding second apertures of the stencil, the stencil is fixed on the frame body. The guide pins have respective perforations, and a wire is penetrated through the perforations. By selectively loosening or tightening the wire, a tension of the stencil is adjustable.

18 Claims, 9 Drawing Sheets

STENCIL ASSEMBLY STRUCTURE

FIELD OF THE INVENTION

The present invention relates to a stencil assembly structure, and more particularly to a stencil assembly structure for printing solder paste on a printed circuit board.

BACKGROUND OF THE INVENTION

A surface mount technology (SMT) is a method for mounting electronic components on the surface of a printed circuit board. The surface mount technology is capable of automatically fabricating small-sized, reliable, high-density and cost-effective electronic products. Generally, the solder paste printing pattern for the surface mount technology is defined by the apertures of a stencil. In addition, solder paste may pass through the apertures of the stencil to corresponding bonding pads of the printed circuit board. In other words, the stencil is a very important part of the surface mount technology. Moreover, the tension of the stencil should be maintained at a certain level. By the tension, the solder paste printed on the bonding pads will not stain the stencil, and thus the solder paste will not be detached. That is, if the tension is insufficient, the printing quality is deteriorated.

FIG. 1 is a schematic exploded view illustrating a conventional assembled solder paste printing structure for printing solder paste on a printed circuit board. As shown in FIG. 1, the conventional assembled solder paste printing structure 9 comprises a fixing frame 91, a hollowed-out rectangular stretching net 92, and a steel plate 93. The steel plate 93 is rectangular, and has a rectangular solder paste printing region 931 and a fixing region 932. The four sides of the solder paste printing region 931 are surrounded by the fixing region 932. The solder paste printing region 931 comprises plural apertures 9311 for providing solder paste. The fixing region 932 is attached on inner edges of four sides of the stretching net 92. Consequently, equal pulling forces are applied to the outer edges of the four sides of the stretching net 92 to outwardly tighten the stretching net 92 in order flatten the steel plate 93. Then, the steel plate 93 is fixed in the clamping slots 911 at the four sides of the fixing frame 91.

A process of using the conventional assembled solder paste printing structure 9 will be illustrated as follows. Firstly, a printed circuit board (not shown) is fixed on a platform (not shown) of a machine (not shown) horizontally. Then, the fixing frame 91 of the conventional assembled solder paste printing structure 9 is fixed on the machine. Then, the steel plate 93 of the conventional assembled solder paste printing structure 9 is aligned with and placed on the printed circuit board. Then, solder paste is scraped across the solder paste printing region 931 of the steel plate 93, so that the solder paste is provided within the apertures 9311 of the steel plate 93 and adhered on the printed circuit board. Afterwards, the conventional assembled solder paste printing structure 9 is removed. Consequently, plural solder paste spots are spread on the printed circuit board, and the printed circuit board is further processed.

However, the use of the conventional assembled solder paste printing structure still has some drawbacks. For example, since the tension is not uniformly and properly distributed on the rectangular steel plate, the printing quality is usually unsatisfied. Moreover, after the conventional assembled solder paste printing structure has been used for a certain time period, the tension of the rectangular steel plate is possibly destroyed and impaired. Moreover, since the conventional assembled solder paste printing structure cannot be disassembled, the conventional assembled solder paste printing structure fail to match various printed circuit boards. Under this circumstance, the assembling process is complicated, and the assembling cost is increased.

Therefore, there is a need of providing an improved stencil assembly structure in order to eliminate the above drawbacks.

SUMMARY OF THE INVENTION

The present invention provides a stencil assembly structure for printing solder paste on a printed circuit board. The stencil assembly structure can be fabricated in a simplified and cost-effective manner. Moreover, the tension of the stencil can be manually adjusted to be maintained at a sufficient level. Under this circumstance, the possibility of detaching the solder paste is minimized, and the printing quality is enhanced.

An aspect of the present invention provides a stencil assembly structure for printing solder paste on a printed circuit board. The stencil assembly structure includes a stencil and a fixing frame. The stencil includes plural first apertures and plural second aperture. The plural first apertures are collaboratively defined as a solder paste printing pattern. The fixing frame includes a frame body and plural guide pins. After the plural guide pins of the frame body are penetrated through the corresponding second apertures of the stencil, the stencil is fixed on the frame body. The guide pins have respective perforations, and a wire is penetrated through the perforations. By selectively loosening or tightening the wire, a tension of the stencil is adjustable.

In an embodiment, the stencil is a circular stencil, and the stencil is a stainless steel plate.

In an embodiment, the plural guide pins are protruded upwardly from a surface of the frame body.

In an embodiment, the frame body includes a rectangular support region and a ring-shaped support region, wherein the ring-shaped support region is located inside the rectangular support region. The frame body includes plural ribs, wherein the ribs are connected between the rectangular support region and the ring-shaped support region.

In an embodiment, the fixing frame further includes an outer frame plate, wherein the outer frame plate is disposed on the rectangular support region of the frame body.

In an embodiment, the fixing frame further includes plural fixing seats. The plural fixing seats are arranged on the ring-shaped support region of the frame body.

In an embodiment, the fixing frame further includes plural fixing seats. The plural fixing seats are disposed on the frame body. Each of the plural fixing seats includes a slot for allowing a corresponding guide pin to pass through. Each of the plural guide pins is protruded out of a top surface of the corresponding fixing seat.

In an embodiment, the fixing seat has a generally inverted U-shaped structure, and the perforation of the corresponding guide pin is aligned with a generally inverted U-shaped notch of the fixing seat, so that the wire is penetrated through the perforation.

In an embodiment, the plural fixing seats are made of aluminum, the plural guide pins are made of aluminum, and the wire is a steel wire.

In an embodiment, the fixing frame further includes a tension adjusting mechanism, and an outlet part of the wire is connected with the tension adjusting mechanism, so that the wire is selectively loosened or tightened by the tension adjusting mechanism. In addition, the tension adjusting mechanism has a hand crank.

In an embodiment, the fixing frame further includes a locking ring for locking the stencil on the frame body.

Another aspect of the present invention provides a fixing frame of a stencil. The stencil is configured for printing solder paste on a printed circuit board. The stencil includes plural first apertures and plural second apertures. The plural first apertures are collaboratively defined as a solder paste printing pattern. The fixing frame includes a frame body and plural guide pins. The plural guide pins are protruded upwardly from a surface of the frame body. After the plural guide pins of the frame body are penetrated through the corresponding second apertures of the stencil, the stencil is fixed on the frame body. The guide pins have respective perforations, and a wire is penetrated through the perforations. By selectively loosening or tightening the wire, a tension of the stencil is adjustable.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
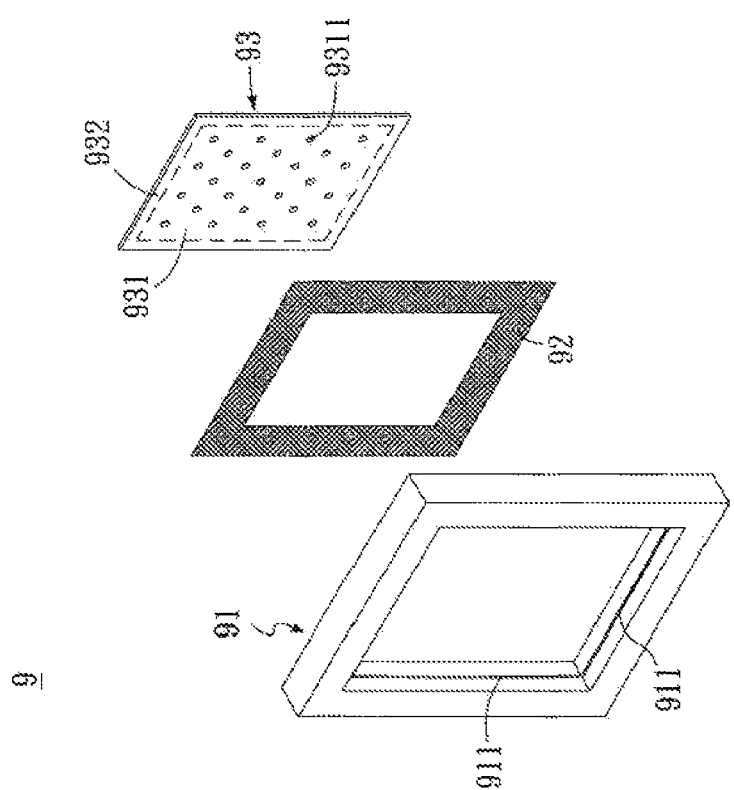
FIG. 1 is a schematic exploded view illustrating a conventional assembled solder paste printing structure for printing solder paste on a printed circuit board.
Figure 2:
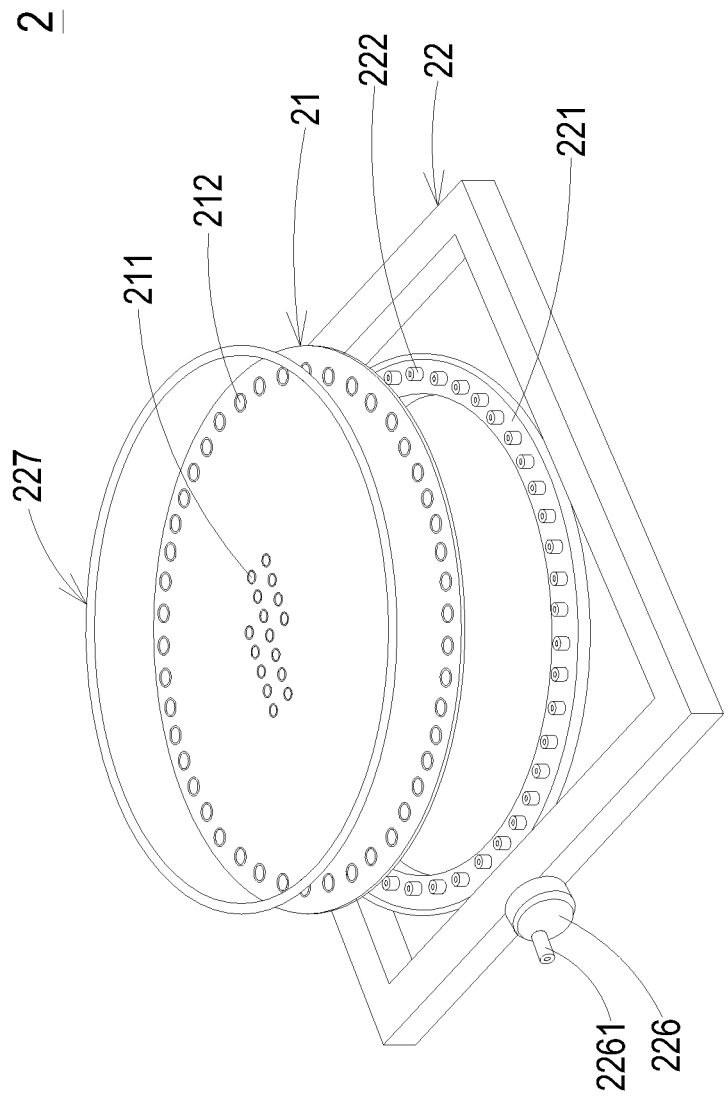
FIG. 2 is a schematic exploded view illustrating a stencil assembly structure according to an embodiment of the present invention.

FIG. 2 is a schematic exploded view illustrating a stencil assembly structure according to an embodiment of the present invention. The stencil assembly structure 2 is used for printing solder paste on a printed circuit board. As shown in FIG. 2, the stencil assembly structure 2 comprises a stencil 21 and a fixing frame 22. The stencil 21 comprises plural first apertures 211 and plural second apertures 212. The plural first apertures 211 are formed by a laser cutting process, and collaboratively defined as a solder paste printing pattern. It is preferred that the stencil 21 is a circular stencil. Moreover, the plural second apertures 212 are discretely and circularly arranged along an outer edge of the stencil 21. The fixing frame 22 comprises a frame body 221 and plural guide pins 222. The plural guide pins 222 are protruded upwardly from a surface of the frame body 221. After the plural guide pins 222 on the frame body 221 are penetrated through the corresponding second apertures 212 of the stencil 21, the stencil 21 is hitched on the guide pins 222, so that the stencil 21 is fixed on the frame body 221.

In an embodiment, the stencil 21 is made of a metallic material. For example, the stencil 21 is a stainless steel plate, but is not limited thereto. Moreover, the plural guide pins 222 are also made of a metallic material (e.g. aluminum).

As previously described, the tension cannot be uniformly and properly distributed on the rectangular steel plate. Experiments demonstrated that the tension can be distributed on the circular stencil more uniformly and properly. In other words, the use of the circular stencil in the present invention can enhance the printing quality.

Figure 3:
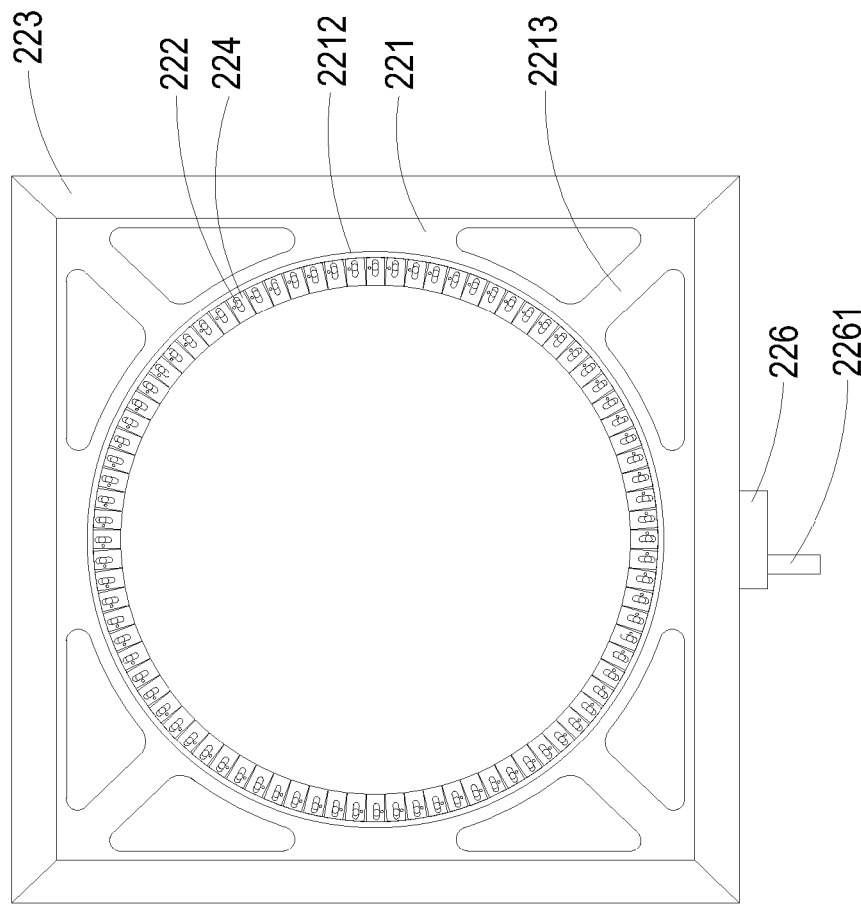
FIG. 3 is a schematic top view illustrating the fixing frame of the stencil assembly structure according to the embodiment of the present invention.
Figure 4:
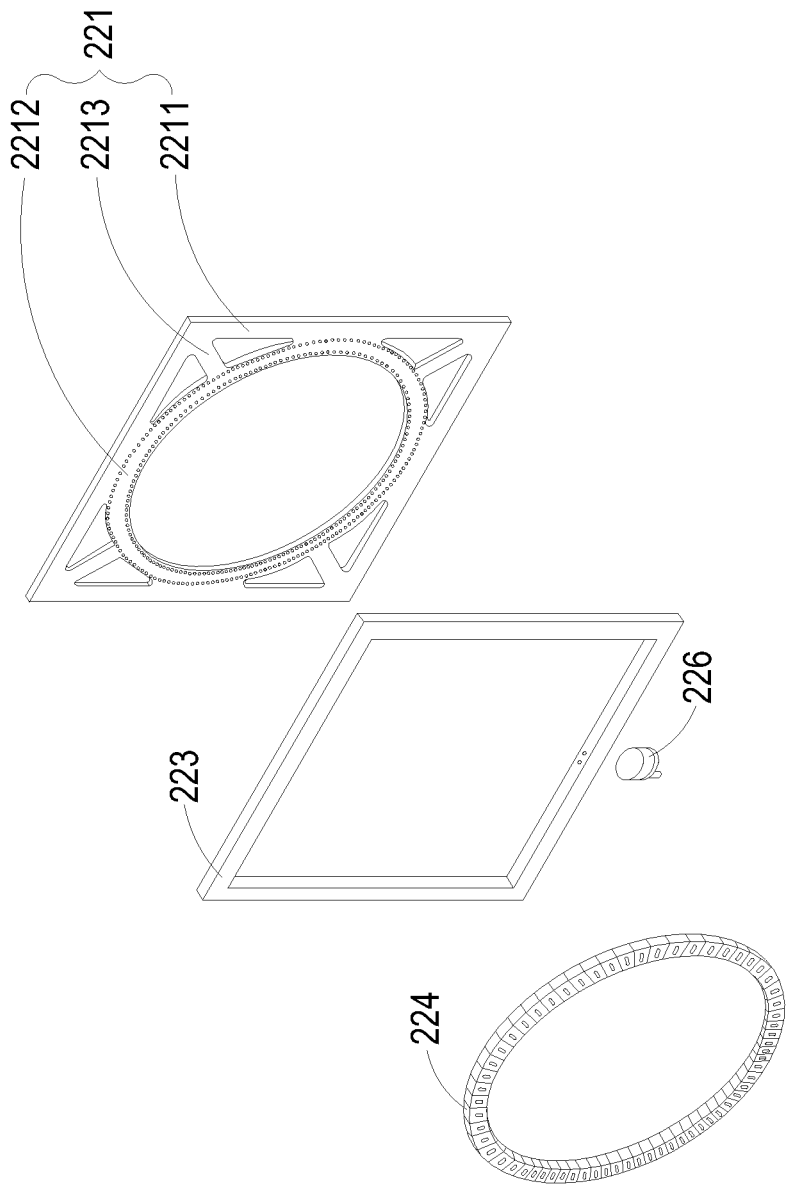
FIG. 4 is a schematic exploded view illustrating the fixing frame of the stencil assembly structure according to the embodiment of the present invention.

FIG. 3 is a schematic top view illustrating the fixing frame of the stencil assembly structure according to the embodiment of the present invention. FIG. 4 is a schematic exploded view illustrating the fixing frame of the stencil assembly structure according to the embodiment of the present invention. As shown in FIGS. 3 and 4, the fixing frame 22 comprises the frame body 221, the plural guide pins 222, an outer frame plate 223, and plural fixing seats 224. The frame body 221 comprises a rectangular support region 2211 and a ring-shaped support region 2212. The ring-shaped support region 2212 is located inside the rectangular support region 2211. The rectangular support region 2211 and the ring-shaped support region 2212 are connected with each other through plural ribs 2213. The outer frame plate 223 is disposed on the rectangular support region 2211 of the frame body 221. The plural fixing seats 224 are circularly arranged on the ring-shaped support region 2212 of the frame body 221.

Figure 5C:
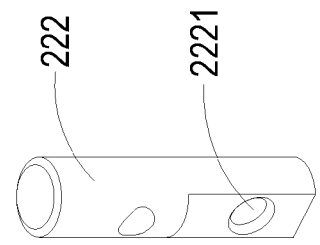
FIG. 5C is a schematic perspective view illustrating a guide pin of the fixing frame of the stencil assembly structure according to the embodiment of the present invention.
Figure 5B:
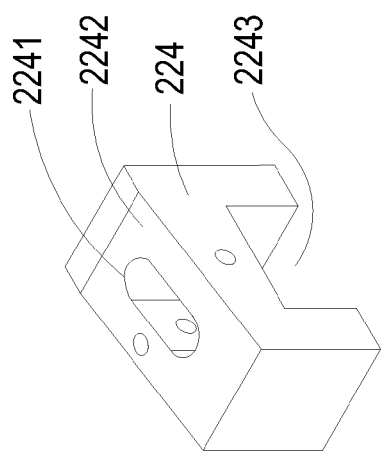
FIG. 5B is a schematic perspective view illustrating a fixing seat of the fixing frame of the stencil assembly structure according to the embodiment of the present invention.
Figure 5A:
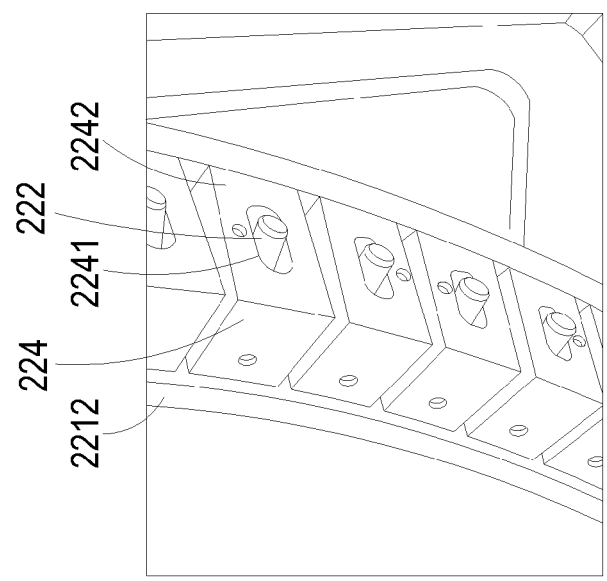
FIG. 5A is a schematic perspective view illustrating a portion of the fixing frame of the stencil assembly structure according to the embodiment of the present invention.

Hereinafter, the relationships between the plural guide pins 222 and the plural fixing seats 224 will be illustrated with reference to FIGS. 5A, 5B and 5C. FIG. 5A is a schematic perspective view illustrating a portion of the fixing frame of the stencil assembly structure according to the embodiment of the present invention. FIG. 5B is a schematic perspective view illustrating a fixing seat of the fixing frame of the stencil assembly structure according to the embodiment of the present invention. FIG. 5C is a schematic perspective view illustrating a guide pin of the fixing frame of the stencil assembly structure according to the embodiment of the present invention. The fixing seats 224 are disposed on the ring-shaped support region 2212 of the frame body 221. Each of the fixing seats 224 comprises a slot 2241 for allowing a corresponding guide pin 222 to pass through. In addition, the guide pin 222 is protruded out of a top surface 2242 of the corresponding fixing seat 224. After the plural guide pins 222 are penetrated through the corresponding second apertures 212 of the stencil 21, the stencil 21 is attached on the top surfaces 2242 of the fixing seats 224.

In this embodiment, the fixing seat 224 has a generally inverted U-shaped structure. The slot 2241 is formed in the top surface 2242 of the corresponding fixing seat 224. Moreover, the plural fixing seats 224 are made of a metallic material (e.g. aluminum). The fixing seats 224 and the guide pins 222 are fixed on the ring-shaped support region 2212 of the frame body 221 through an adhering means, a fastening means or a screwing means. It is noted that the ways of fixing the fixing seats 224 and the guide pins 222 are not restricted.

Figure 6:
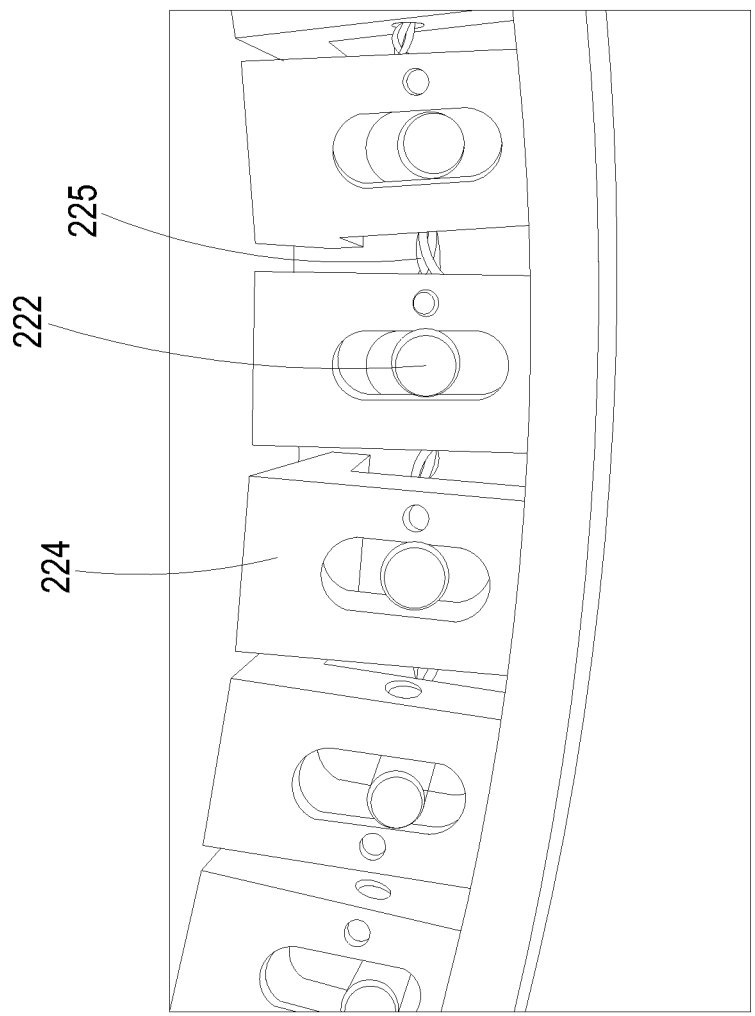
FIG. 6 is a schematic perspective view illustrating a portion of the fixing frame of the stencil assembly structure according to the embodiment of the present invention and taken along another viewpoint.

FIG. 6 is a schematic perspective view illustrating a portion of the fixing frame of the stencil assembly structure according to the embodiment of the present invention and taken along another viewpoint. Please refer to FIGS. 5C and 6. Each of the guide pins 222 has a perforation 2221. The perforation 2221 is located at a bottom end of the guide pin 222 and aligned with a generally inverted U-shaped notch 2243 of the corresponding fixing seat 224. Moreover, a wire 225 is penetrated through the perforations 2221 of the guide pins 222. An example of the wire 225 includes but is not limited to a metal wire (e.g. a steel wire).

Figure 7:
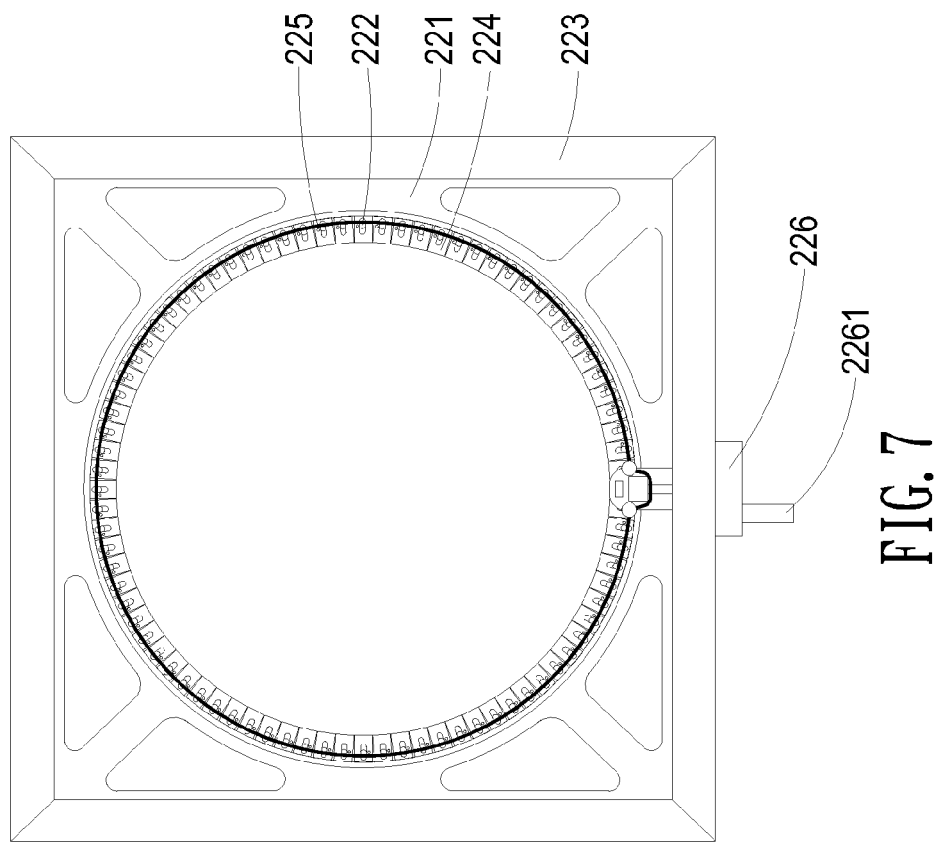
FIG. 7 is a schematic top view illustrating the relationship between the fixing frame and a tension adjusting mechanism of the stencil assembly structure according to the embodiment of the present invention.
Figure 8A:
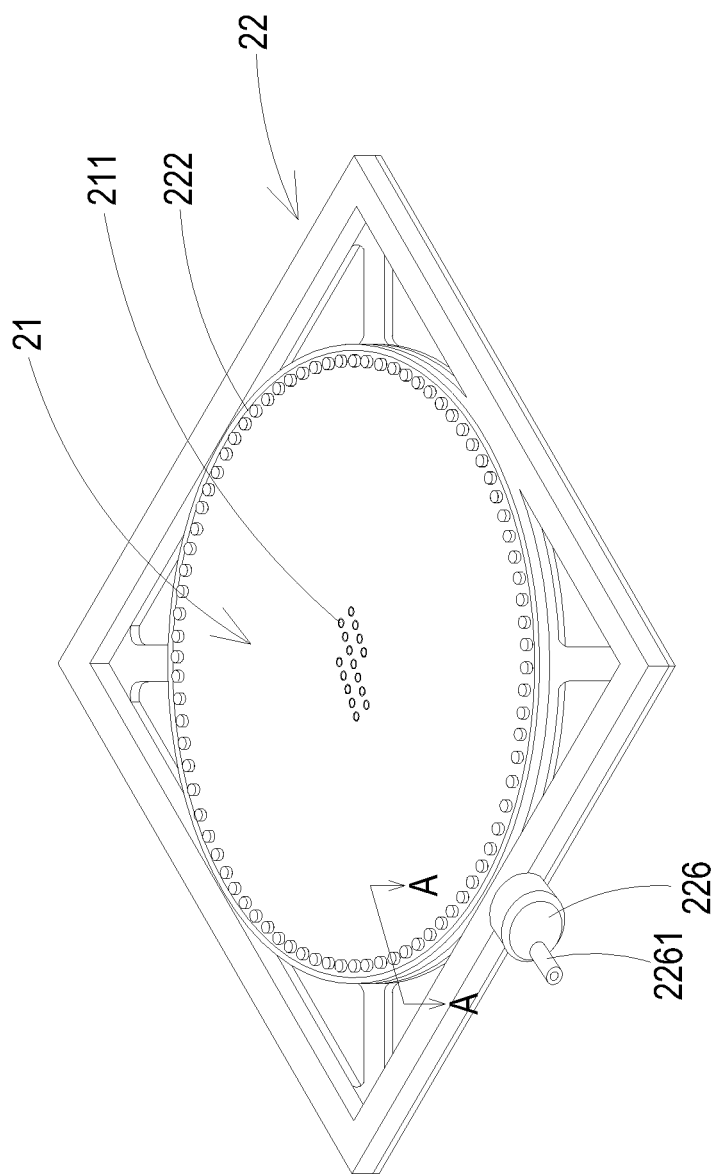
FIG. 8A is a schematic perspective view illustrating the stencil assembly structure according to the embodiment of the present invention.
Figure 8B:
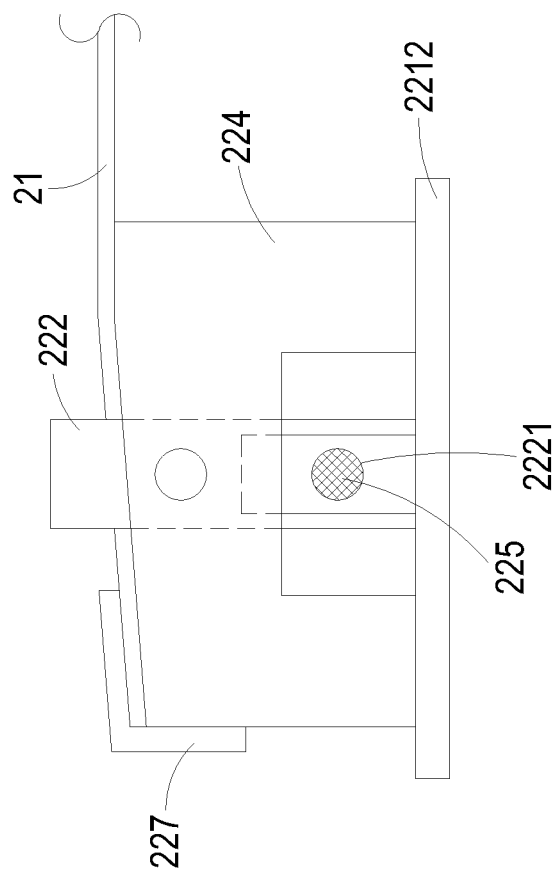
FIG. 8B is a schematic cross-sectional view illustrating the stencil assembly structure of FIG. 8A and taken along a line AA.

FIG. 7 is a schematic top view illustrating the relationship between the fixing frame and a tension adjusting mechanism of the stencil assembly structure according to the embodiment of the present invention. For illustrating the tension adjusting mechanism 226, the wire 225 is also shown in FIG. 7. FIG. 8A is a schematic perspective view illustrating the stencil assembly structure according to the embodiment of the present invention. FIG. 8B is a schematic cross-sectional view illustrating the stencil assembly structure of FIG. 8A and taken along a line AA. Please refer to FIGS. 7, 8A and 8B. The fixing seats 224 are disposed on the ring-shaped support region 2212 of the frame body 221. The guide pins 222 are penetrated through the corresponding fixing seats 224. In other words, the fixing seats 224 and the guide pins 222 are circularly arranged on the ring-shaped support region 2212 of the frame body 221. Since the wire 225 is penetrated through the perforations 2221 at the bottom ends of the guide pins 222, the wire 225 is wound as a circular profile. In addition, an outlet part of the wire 225 is connected with the tension adjusting mechanism 226. The tension adjusting mechanism 226 is capable of adjusting the looseness/tightness of the wire 225, thereby adjusting the tension of the wire 225.

In this embodiment, the tension adjusting mechanism 226 is a winch. In addition, the tension adjusting mechanism 226 has a hand crank 2261 for allowing the user to wind up or wind out the wire 225. Consequently, the guide pins 222 have the tendency to be moved toward or away from a center of the frame body 221. Since the stencil 21 is hitched on the guide pins 222, the tension of the stencil 21 is correspondingly adjusted.

Consequently, according to the design of the present invention, the tension of the stencil 21 can be manually adjusted. Especially, if the tension is insufficient after the stencil 21 is used for a certain time period, the tension of the stencil 21 may be adjusted by the tension adjusting mechanism 226. Under this circumstance, the tension of the stencil 21 is enhanced, the possibility of detaching the solder paste is minimized, and the printing quality is enhanced.

Moreover, the process of assembling the stencil 21 and the fixing frame 22 is very simple. After the plural guide pins 222 on the frame body 221 are penetrated through the corresponding second apertures 212 of the stencil 21, the stencil 21 can be fixed on the frame body 221. Consequently, even if the solder paste printing pattern is changed, overdue or damaged, the user only has to replace the stencil 21 without the need of disassembling and re-assembling the fixing frame. In other words, the stencil assembly structure 2 can be fabricated in a simplified and cost-effective manner.

Please refer to FIG. 2 and FIG. 8B again. The fixing frame 22 further comprises a locking ring 227. The size and shape of the locking ring 227 match the size and shape of the stencil 21. In addition, the locking ring 227 has an L-shaped cross section. The locking ring 227 is capable of locking the stencil 21 on the fixing seats 224 of the frame body 221, thereby preventing detachment of the stencil 21 from the frame body 221.

From the above descriptions, the present invention provides a stencil assembly structure for printing solder paste on a printed circuit board. The stencil assembly structure includes a stencil and a fixing frame. The stencil includes plural first apertures and plural second aperture. The plural first apertures are collaboratively defined as a solder paste printing pattern. The fixing frame includes a frame body and plural guide pins. After the plural guide pins of the frame body are penetrated through the corresponding second apertures of the stencil, the stencil is fixed on the frame body. The guide pins have respective perforations, and a wire is penetrated through the perforations. By selectively loosening or tightening the wire, a tension of the stencil is adjustable. According to the design of the present invention, the tension of the stencil can be manually adjusted to be maintained at a sufficient level. Under this circumstance, the possibility of detaching the solder paste is minimized, and the printing quality is enhanced. Moreover, since the process of assembling the stencil and the fixing frame is very simple, the stencil assembly structure can be fabricated in a simplified and cost-effective manner. Moreover, since the tension can be distributed on the circular stencil more uniformly and properly, the printing quality is enhanced. Therefore, the stencil assembly structure of the present invention can overcome the disadvantages of the prior art technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stencil assembly structure for printing solder paste on a printed circuit board, the stencil assembly structure comprising:
   a stencil comprising plural first apertures and plural second apertures, wherein the plural first apertures are collaboratively defined as a solder paste printing pattern; and
   a fixing frame comprising a frame body and plural guide pins, wherein after the plural guide pins of the frame body are penetrated through the corresponding second apertures of the stencil, the stencil is fixed on the frame body,
   wherein the guide pins have respective perforations, and a wire is penetrated through the perforations, wherein by selectively loosening or tightening the wire, a tension of the stencil is adjustable.

2. The stencil assembly structure according to claim 1, wherein the stencil is a circular stencil.

3. The stencil assembly structure according to claim 1, wherein the stencil is a stainless steel plate.

4. The stencil assembly structure according to claim 1, wherein the plural guide pins are protruded upwardly from a surface of the frame body.

5. The stencil assembly structure according to claim 1, wherein the frame body comprises a rectangular support region and a ring-shaped support region, wherein the ring-shaped support region is located inside the rectangular support region.

6. The stencil assembly structure according to claim 5, wherein the frame body comprises plural ribs, wherein the ribs are connected between the rectangular support region and the ring-shaped support region.

7. The stencil assembly structure according to claim 5, wherein the fixing frame further comprises an outer frame plate, wherein the outer frame plate is disposed on the rectangular support region of the frame body.

8. The stencil assembly structure according to claim 5, wherein the fixing frame further comprises plural fixing seats, wherein the plural fixing seats are arranged on the ring-shaped support region of the frame body.

9. The stencil assembly structure according to claim 1, wherein the fixing frame further comprises plural fixing seats, wherein the plural fixing seats are disposed on the frame body, wherein each of the plural fixing seats comprises a slot for allowing a corresponding guide pin to pass through.

10. The stencil assembly structure according to claim 9, wherein each of the plural guide pins is protruded out of a top surface of the corresponding fixing seat.

11. The stencil assembly structure according to claim 9, wherein the fixing seat has a generally inverted U-shaped structure, and the perforation of the corresponding guide pin is aligned with a generally inverted U-shaped notch of the fixing seat, so that the wire is penetrated through the perforation.

12. The stencil assembly structure according to claim 9, wherein the plural fixing seats are made of aluminum.

13. The stencil assembly structure according to claim 1, wherein the plural guide pins are made of aluminum.

14. The stencil assembly structure according to claim 1, wherein the wire is a steel wire.

15. The stencil assembly structure according to claim 1, wherein the fixing frame further comprises a tension adjusting mechanism, and an outlet part of the wire is connected with the tension adjusting mechanism, so that the wire is selectively loosened or tightened by the tension adjusting mechanism.

16. The stencil assembly structure according to claim 15, wherein the tension adjusting mechanism has a hand crank.

17. The stencil assembly structure according to claim 1, wherein the fixing frame further comprises a locking ring for locking the stencil on the frame body.

18. A fixing frame of a stencil, the stencil being configured for printing solder paste on a printed circuit board, the stencil comprising plural first apertures and plural second apertures, the plural first apertures being collaboratively defined as a solder paste printing pattern, the fixing frame comprising:

a frame body; and plural guide pins protruded upwardly from a surface of the frame body, wherein after the plural guide pins of the frame body are penetrated through the corresponding second apertures of the stencil, the stencil is fixed on the frame body, wherein the guide pins have respective perforations, and a wire is penetrated through the perforations, wherein by selectively loosening or tightening the wire, a tension of the stencil is adjustable.

* * * * *